United States Patent
Iwashita et al.

[11] Patent Number: 6,142,481
[45] Date of Patent: *Nov. 7, 2000

[54] PISTON RING

[75] Inventors: Takatsugu Iwashita, Matsumoto; Nobuyuki Yamashita, Shiojiri, both of Japan

[73] Assignee: Teikoku Piston Ring Co., Ltd., Tokyo, Japan

[*] Notice: This patent is subject to a terminal disclaimer.

[21] Appl. No.: 09/161,263

[22] Filed: Sep. 28, 1998

[30] Foreign Application Priority Data

Sep. 30, 1997 [JP] Japan .................................. 9-282863
Jul. 13, 1998 [JP] Japan .................................. 10-213527

[51] Int. Cl.[7] ...................................................... F16J 9/26
[52] U.S. Cl. .......................... 277/443; 277/442; 277/444; 277/938
[58] Field of Search ................................ 277/310, 442, 277/443, 444, 534, 538, 938

[56] References Cited

U.S. PATENT DOCUMENTS

| | | |
|---|---|---|
| 4,974,498 | 12/1990 | Lemelson . |
| 5,582,414 | 12/1996 | Miyazaki et al. ...................... 277/444 |
| 5,601,293 | 2/1997 | Fukutome et al. ..................... 277/443 |
| 5,743,536 | 4/1998 | Komuro et al. ........................ 277/440 |
| 5,820,131 | 10/1998 | Tanaka et al. ......................... 277/442 |
| 5,960,762 | 10/1999 | Imai .................................. 277/440 X |

FOREIGN PATENT DOCUMENTS

| | | |
|---|---|---|
| 195 30 511 | 2/1997 | Germany . |
| 3-260362 | 11/1991 | Japan . |
| 5-179451 | 7/1993 | Japan . |

OTHER PUBLICATIONS

Patent Abstracts of Japan, No. 04000064, Publ. Jun. 1992 (Riken Corp.).

*Primary Examiner*—Anthony Knight
*Assistant Examiner*—Karlena D Schwing
*Attorney, Agent, or Firm*—Armstrong, Westerman, Hattori, McLeland & Naughton

[57] ABSTRACT

A piston ring is formed over the entire surface with a gas nitrided layer and a hard film with a thickness of 0.5 to 30 micrometers on the gas nitrided layer at the upper and lower surfaces. The hard film comprises diamond-like carbon in which are dispersed one or more elements selected from the group consisting of silicon, titanium, tungsten, chromium, molybdenum, niobium, and vanadium. The diamond-like carbon is configured with any one of an amorphous carbon structure, an amorphous carbon structure having partly a diamond structure, or an amorphous carbon structure having partly a graphite structure. The content of the above elements is 5 to 40 atomic percent, and the hard film has a Vicker's hardness in a range from 700 to 2,000. The hard film may be formed directly on the upper and lower surfaces of the piston ring in a thickness from 0.5 to 30 micrometers

12 Claims, 4 Drawing Sheets

PISTON RING

BACKGROUND OF THE INVENTION

1. Technical Field of the Invention

The present invention relates to a piston ring for use in reciprocating internal combustion engines and in particular relates to piston rings mounted in the ring grooves of aluminum alloy pistons and improved to suppress the aluminum adhesion phenomenon.

2. Description of the Related Art

In recent years, engines must meet increased demands for higher output, high revolutions per minute and longer product service life and must also comply with ever stricter exhaust gas emission regulations. The piston ring must therefore function in a yet harsher operating environment. Many of such piston rings are formed typically with a chromium plating film, nitrided layer or physical vapor deposition film on the upper and lower surfaces.

However, piston rings having a nitrided layer or physical vapor deposition film are prone to wear the ring grooves of the aluminum alloy pistons. In particular, piston rings having nitrided layers are prone to cause aluminum adhesion on the upper and lower surfaces, increasing the wear on the ring grooves.

A method is known however, for suppressing aluminum adhesion in the initial stages of engine operation by coating the upper and lower surfaces of the piston ring with a synthetic resin film containing solid lubricant. However, this synthetic resin film has poor wear resistance, so this method has the drawback that suppression of the aluminum adhesion does not last long.

Methods were also proposed for applying a thin film of artificial diamond material to the top surface and outer circumferential surface and ring groove of the piston and to the piston ring in order to improve durability as described in Japanese Patent Laid-open No. 3-260362. However, no detailed description of this thin film of artificial diamond material is listed in Japanese Patent Laid-open No. 3-260362.

Another method (Japanese Patent Laid-open No. 5-179451) as described next, involved use of a diamond-like carbon film. In this method, in order to restrict the adhesion of ferrite structures, a film having amorphous carbon as the main constituent in which tungsten and/or silicon was dispersed was formed on the sliding surface which mates with a sliding surface formed of iron-type material containing ferrite. This technology is utilized for instance, in the hydraulic valve in power steering mechanisms. However, this Japanese Patent Laid-open No. 5-179451 listed absolutely no information regarding aluminum adhesion on the upper and lower surfaces of the piston rings mating with aluminum alloy pistons.

SUMMARY OF THE INVENTION

It is an object of the present invention to provide a piston ring in which aluminum adhesion is prevented on the upper and lower surfaces of the piston ring and suppression of aluminum adhesion continues for a long time.

In the piston ring of the present invention formed with a hard film on at least one side of the upper and lower surfaces, the hard film is characterized by comprising diamond-like carbon in which are dispersed one or more elements selected from the group consisting of silicon, titanium, tungsten, chromium, molybdenum, niobium, and vanadium.

The diamond-like carbon forming a film of the present invention is configured from any one of the following structures.

1. Amorphous carbon structure
2. Amorphous carbon structure having partly a diamond structure.
3. Amorphous carbon structure having partly a graphite structure.

The one or more elements selected from the group consisting of silicon, titanium, tungsten, chromium, molybdenum, niobium, and vanadium are present as either metal or carbides or both.

The scuffing resistance of the diamond-like carbon film is inherently high, however a film having both improved wear resistance and improved resistance to aluminum adhesion can be obtained by including one or more elements (present as metal or carbides or both) selected from the group consisting of silicon, titanium, tungsten, chromium, molybdenum, niobium, and vanadium.

The silicon, titanium, tungsten, chromium, molybdenum, niobium, and vanadium content can be measured with an electron probe microanalyzer. The total atomic ratio of the above elements is preferably 5 to 40 percent and preferably the hard film has a Vicker's hardness within a range of 700 to 2000. When the total atomic ratio falls below 5 percent, the resistance to aluminum adhesion declines. When the total atomic ratio is above 40 percent, the ability to suppress aluminum adhesion declines, resulting from poor sealing, and the wear on the ring groove tends to be increased. When the Vicker's hardness of the hard film is below 700, the wear on the film becomes large, and the service life of the piston ring shortens. When the Vicker's hardness is above 2,000, cracks on the film may occur. More preferably, the total atomic ratio is 10 to 30 percent and a Vicker's hardness for the hard film is within a range of 900 to 1200.

BRIEF DESCRIPTION OF THE DRAWINGS

FIGS. 1(a) and 1(b) are samples in which a hard film is formed on a wear resistant surface treatment layer of a different type. FIG. 1(c) is a sample in which a hard film is applied without forming a wear resistant surface treatment layer of a different type.

DESCRIPTION OF THE PREFERRED EMBODIMENTS

Hereafter, the preferred embodiments of the present invention will be described while referring to FIG. 1(a) to FIG. 1(c).

Figure 1A:
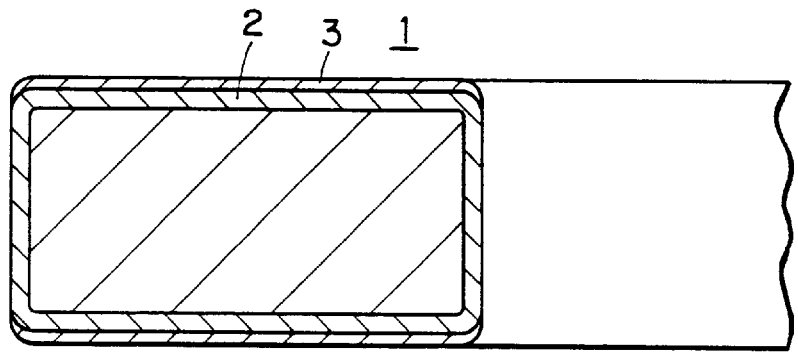
FIGS. 1(a), 1(b) and 1(c) are respectively longitudinal cross sectional views of a portion of the piston rings illustrating embodiments of the present invention.

In FIG. 1(a), a gas nitrided layer 2 with a thickness of 5 to 15 micrometers is formed on the entire surface of a piston ring 1. A hard film 3 with a thickness of 0.5 to 30 micrometers is formed over the gas nitrided layer 2 at the upper and lower surfaces. The hard film 3 comprises diamond-like carbon in which are dispersed carbides of one or more elements selected from the group consisting of silicon, titanium, tungsten, chromium, molybdenum, niobium, and vanadium. The total atomic ratio of one or more elements selected from the group consisting of silicon, titanium, tungsten, chromium, molybdenum, niobium, and vanadium is 5 to 40 percent and the hard film 3 has a Vicker's hardness within a range of 700 to 2000.

Figure 1B:
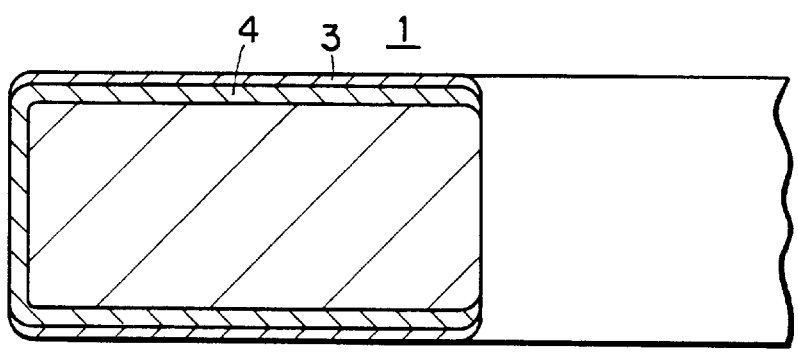

Another example is shown in FIG. 1(b). A chromium plating film, or ion plating film 4 such as chromium nitride (CrN, Cr$_2$N) film or titanium nitride (TiN) film is formed on the upper and lower surfaces and the outer circumferential surface of the piston ring 1. The hard film 3 is formed in a thickness of 0.5 to 30 micrometers over the film 4 at the upper and lower surfaces. When chromium plating film is used, the chromium plating film thickness is 5 to 150 micrometers, and when ion plating film is used, the ion plating film thickness is 1 to 150 micrometers.

Figure 1C:
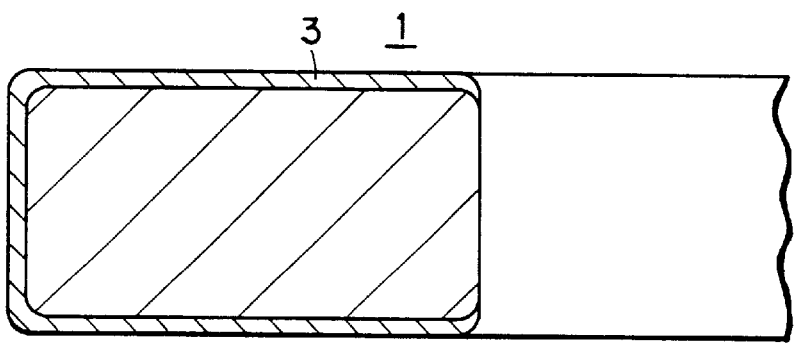

FIG. 1(c) shows an example of the hard film 3 directly formed in a thickness of 0.5 to 30 micrometers on the upper and lower surfaces of the piston ring 1 without forming a wear resistant surface treatment layer (gas nitrided layer 2, or chromium plating film or ion plating film 4) which is different in type from the hard film 3. When the film thickness is lower than 0.5 micrometers, the service life of the piston ring shortens and when above 30 micrometers, the adhesion is inadequate and as a result the ability to suppress the aluminum adhesion declines. The hard film 3 was formed on the outer circumferential surface of the piston ring 1.

The hard film 3 of the above described embodiment was formed on the upper and lower surfaces of the piston ring 1, however the hard film 3 may be formed on just one surface of either the upper or lower surface.

The hard film 3 can be coated by using the reactive ion plating method or reactive sputtering method. For instance, the hard film 3 is coated onto the substrate by the reactive ion plating method as related below. That is, an inert gas is introduced into a vacuum chamber while the substrate is rotated. After cleaning the substrate surface by ion bombardment, a hydrocarbon gas such as methane which is a source of carbon is introduced into the chamber and while the vicinity of the substrate is maintained in a plasma state, one or more elements selected from the group consisting of silicon, titanium, tungsten, chromium, molybdenum, niobium, and vanadium are vaporized. In such cases, by adjusting the partial pressure of hydrocarbon gas in the reactive gas, the one or more atoms selected from the group consisting of silicon, titanium, tungsten, chromium, molybdenum, niobium, and vanadium can be deposited as a carbide. The ratio of the respective contents of the one or more elements selected from the group consisting of silicon, titanium, tungsten, chromium, molybdenum, niobium, and vanadium can be controled by adjusting the pressure of the reactive gas as well as the evaporation speed of these elements.

Hereafter, the high resistance to aluminum adhesion of the piston ring of the present invention will be shown in the measurement results of the piston tap test which indicate the time until aluminum adhesion.

1. Tap test (1) Test piece

The films shown in Table 1 and Table 2 were formed on the upper and lower surfaces of the compression ring (ø 86 mm).

TABLE 1

| No. | Under layer | Structure of hard film on upper/lower surface | Thickness of hard film on upper/lower surface µm | Vicker's hardness of hard film on upper/lower surface |
|---|---|---|---|---|
| Embodiment | | | | |
| 1 | Gas nitrided layer | Amorphous carbon and tungsten carbide (W: 14 atomic percent) | 5 | 1300 |
| 2 | Gas nitrided layer | Amorphous carbon and silicon carbide (Si: 30 atomic percent) | 5 | 1800 |
| 3 | Gas nitrided layer | Amorphous carbon and silicon carbide (Si: 7 atomic percent) | 5 | 1000 |
| 4 | None | Amorphous carbon and tungsten carbide (W: 14 atomic percent) | 5 | 1300 |
| 5 | Chromium plating film 100 µm | Amorphous carbon and tungsten carbide (W: 14 atomic percent) | 5 | 1300 |
| Comparative example | | | | |
| 1 | None | None | — | 450 |
| 2 | None | Gas nitrided layer | 60 | 1000 |

TABLE 2

| No. | Under layer | Structure of hard film on upper/lower surface | Thickness of hard film on upper/lower surface µm | Vicker's hardness of hard film on upper/lower surface |
|---|---|---|---|---|
| Comparative example | | | | |
| 3 | Gas nitrided layer | Resin film containing solid lubricant | 10 | — |
| 4 | Gas nitrided layer | Amorphous carbon | 5 | 500 |

TABLE 2-continued

| No. | Under layer | Structure of hard film on upper/lower surface | Thickness of hard film on upper/lower surface μm | Vicker's hardness of hard film on upper/lower surface |
|---|---|---|---|---|
| 5 | Gas nitrided layer | Amorphous carbon and silicon carbide (Si: 4 atomic percent) | 5 | 650 |
| 6 | Gas nitrided layer | Amorphous carbon and silicon carbide (Si: 42 atomic percent) | 5 | 2100 |

The base material of the embodiments 4, 5 and the comparative example 1 is Si—Cr steel. The base material of the embodiments 1–3 and the comparative examples 2–6 is 17Cr stainless steel.

(2) Hard film forming method

The hard film was formed by the reactive ion plating method as related previously. The substrate temperature was within a range of 200 to 500° C.

(3) X-ray diffraction of hard film

The structures of the films of the embodiments 1–5 and comparative examples 4–6 were analyzed by X-ray diffraction of each test piece. The X-ray tube was a copper tube and a monochromator was used. The tube voltage was 40 kilovolts and the tube current was 30 milliamperes. An X-ray diffraction pattern of the embodiment 5 is shown in FIG. 4.

Figure 4:
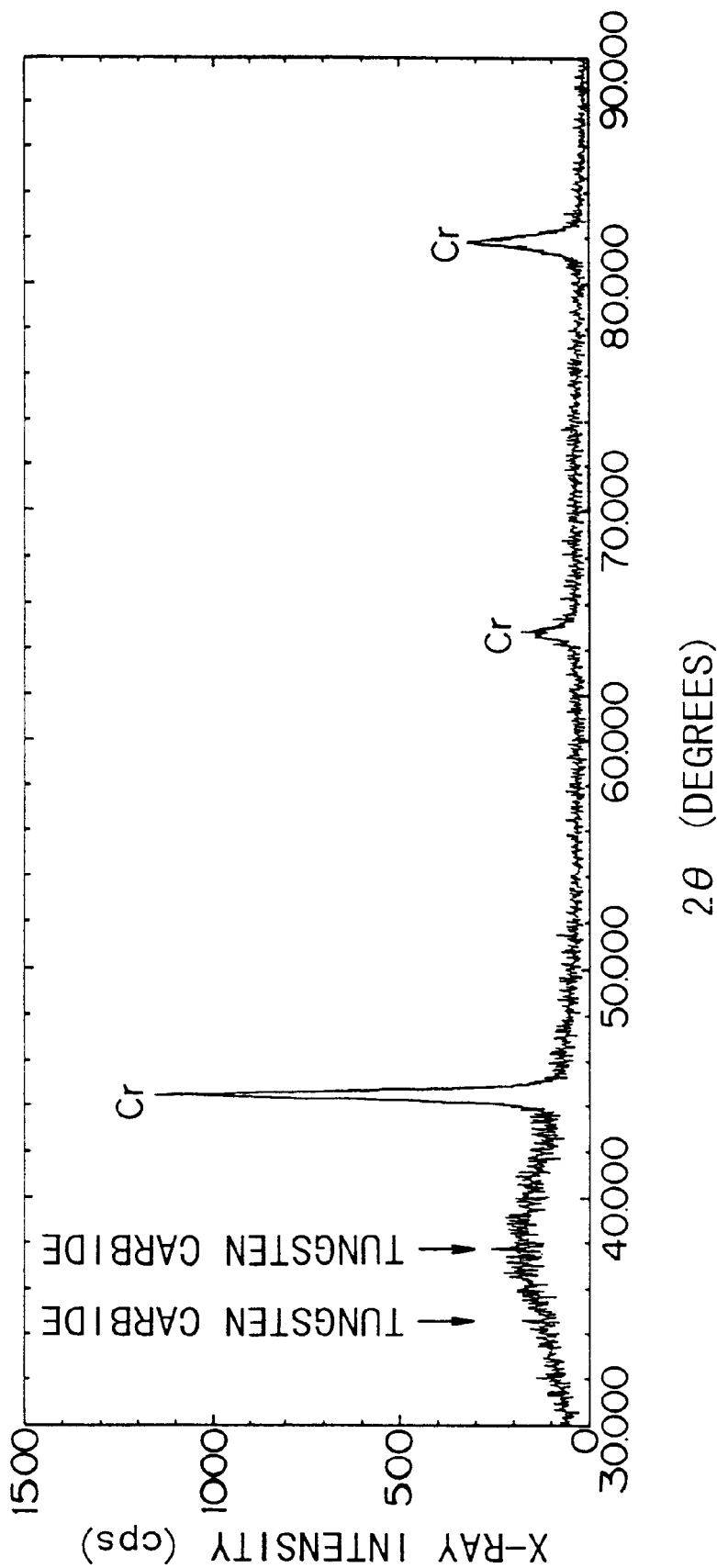
FIG. 4 is an X-ray diffraction pattern of the film of embodiment 5.

FIG. 4 shows the following matters.

1. A halo is present in 2θ=34° to 42°, which shows that film has amorphous structure.
2. The diffraction peak in the vicinity of 2θ=44.5°, 65° and 82° is the diffraction ray from the chromium plating film of the under layer.
3. The diffraction peak for the tungsten carbide which can be identified as $W_2C$ or $W_6C_{2.54}$ is present in the vicinity of 2θ=34.5° and 38°.
4. There is no diffraction peak for metallic tungsten in the vicinity of 2θ=40°, 58° and 73°.

It can be seen from the above items that the film of the embodiment 5 has a structure comprised of amorphous carbon and tungsten carbide.

(4) Microwelding rig tester

Figure 2:
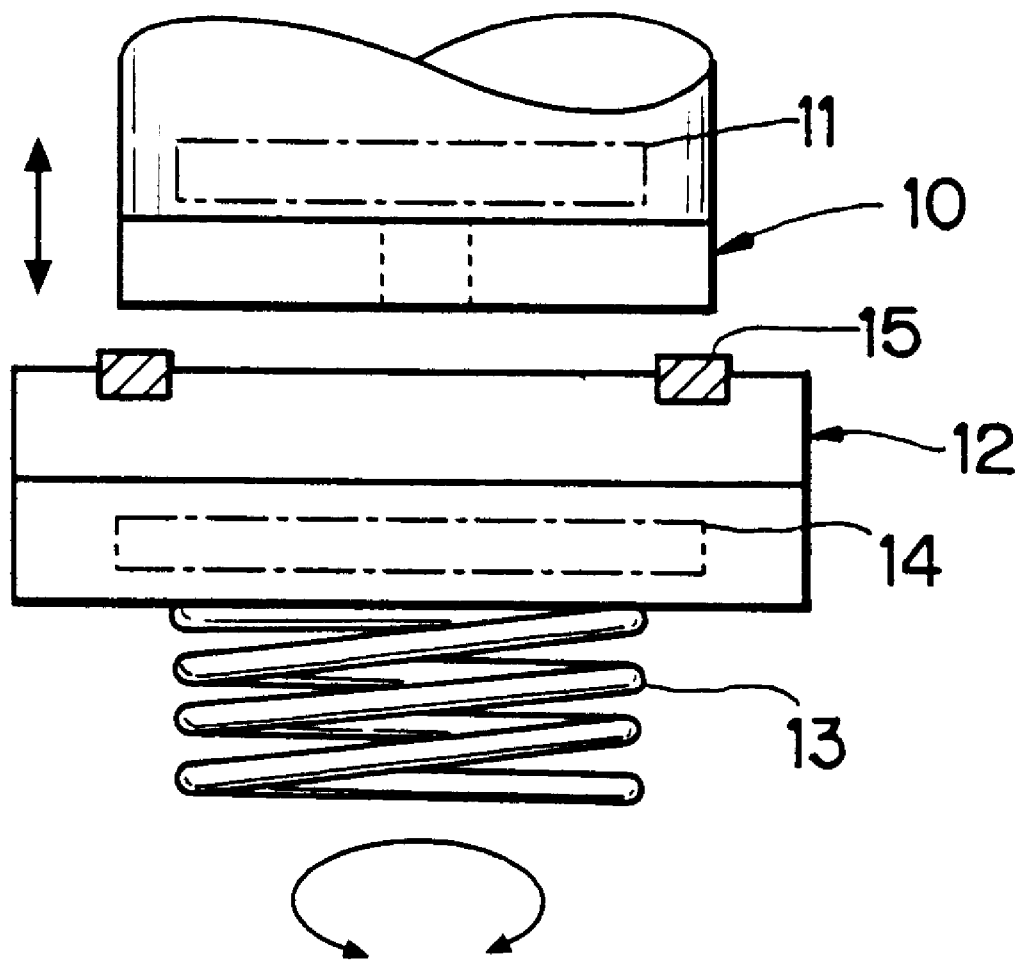
FIG. 2 is a drawing showing a configuration of the piston tap testing machine.

The structure of a microwelding rig tester is shown in FIG. 2. An upward and downward moving aluminum alloy (AC8A) piston member 10 (ø 86 mm×thickness 10 mm) is provided with a heater 11 on the upper side. A test piece support member 12 supported by a spring 13 is disposed at a position below the piston member 10, and has an annular groove on the upper surface and a heater 14 on the lower side. A test piece 15 which is a piston ring is mounted in the annular groove of the test piece support member 12 and is supported in a state slightly protruding from the upper surface of the test piece support member 12. The test piece support member 12 repeatedly rotates and reverses in a horizontal plane in 180°. Therefore, the test piece 15 which is the piston ring is tapped by the flat bottom of the upward and downward moving piston member 10 while repeatedly rotated and reversed in a horizontal plane in 180° by the test piece support member 12.

(5) Test conditions

Tap load: 30 kg

Tap speed: 700 times per minute

Rotation speed of piston member: 10 c.p.m., 180°

Test temperature: 200° C.

Lubricant: None (6) Test results

Figure 3:
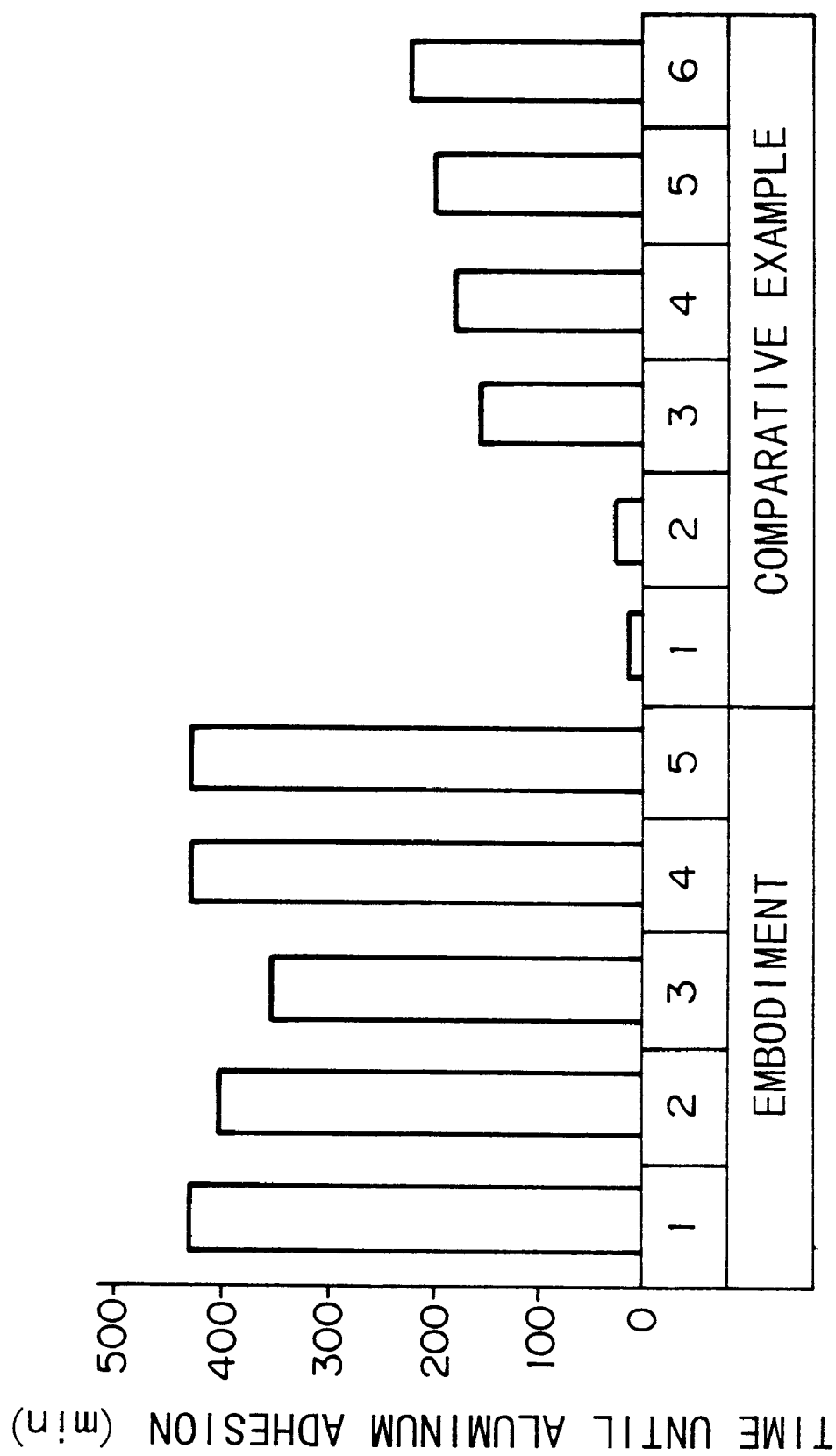
FIG. 3 is a graph showing test results from the tap tests.

The times until aluminum adhesion due to the microwelding rig tester are shown in FIG. 3. The following facts were revealed by these test results.

The time required for aluminum adhesion to occur in the piston ring of the present invention is considerably longer than for the piston ring covered with a resin film of the conventional art.

The time required for aluminum adhesion to occur in the hard film comprising diamond-like carbon can be lengthened by containing tungsten carbide or silicon carbide in specified amounts.

The hard film in this test was comprised of diamond-like carbon as the main constituent and tungsten carbide or silicon carbide, however the same effect can be obtained with a hard film comprising diamond-like carbon in which are dispersed one or more elements (present as metal or carbides or both) selected from the group consisting of silicon, titanium, tungsten, chromium, molybdenum, niobium, and vanadium.

Although the present invention has been described with reference to the preferred embodiments, it is apparent that the present invention is not limited to the aforesaid preferred embodiments, but various modification can be attained without departing from its scope.

What is claimed is:

1. A piston ring having a hard film on at least one side of the upper and lower surfaces of said piston ring, wherein said hard film comprises diamond-like carbon in which are dispersed one or more elements selected from the group consisting of silicon, titanium, tungsten, chromium, molybdenum, niobium, and vanadium.

2. A piston ring as claimed in claim 1, wherein said one or more elements selected from the group consisting of silicon, titanium, tungsten, chromium, molybdenum, niobium, and vanadium are present as either metal or carbides or both.

3. A piston ring as claimed in claim 2, wherein content of said one or more elements selected from the group consisting of silicon, titanium, tungsten, chromium, molybdenum, niobium, and vanadium is 5 to 40 atomic percent, and a Vicker's hardness of said hard film is within a range of 700 to 2000.

4. A piston ring as claimed in claim 3, wherein said hard film has a thickness of 0.5 to 30 micrometers.

5. A piston ring as claimed in claim 4, wherein said hard film is formed on a wear resistant surface treatment layer of a different type.

6. A piston ring as claimed in claim 5, wherein said wear resistant surface treatment layer of a different type is comprised of a chromium plating film, nitrided layer or ion plating film.

7. A piston ring as claimed in claim 4, wherein said hard film is formed directly on at least one side of the upper and lower surfaces of said piston ring.

8. A piston ring as claimed in claim 1, wherein content of said one or more elements selected from the group consisting of silicon, titanium, tungsten, chromium, molybdenum, niobium, and vanadium is 5 to 40 atomic percent, and a Vicker's hardness of said hard film is within a range of 700 to 2000.

9. A piston ring as claimed in claim 8, wherein said hard film has a thickness of 0.5 to 30 micrometers.

10. A piston ring as claimed in claim 9, wherein said hard film is formed on a wear resistant surface treatment layer of a different type.

11. A piston ring as claimed in claim 10, wherein said wear resistant surface treatment layer of a different type is comprised of a chromium plating film, nitrided layer or ion plating film.

12. A piston ring as claimed in claim 9, wherein said hard film is formed directly on at least one side of the upper and lower surfaces of said piston ring.

* * * * *